United States Patent [19]

Mueller

[11] 4,438,561

[45] Mar. 27, 1984

[54] METHOD OF REWORKING PRINTED CIRCUIT BOARDS

[75] Inventor: Richard W. Mueller, Santa Clara, Calif.

[73] Assignee: Rogers Corporation, Rogers, Conn.

[21] Appl. No.: 307,197

[22] Filed: Oct. 1, 1981

[51] Int. Cl.³ .............................................. H05K 3/20
[52] U.S. Cl. ........................................ 29/831; 29/846
[58] Field of Search ................ 29/830, 831, 851, 846; 228/6 A; 174/68.5; 264/61; 361/414

[56] References Cited

U.S. PATENT DOCUMENTS

| 3,715,802 | 2/1973 | Svenaga et al. | 29/588 |
| 3,852,877 | 12/1974 | Ahn et al. | 29/830 |
| 4,157,932 | 6/1979 | Hirata | 29/830 X |
| 4,184,729 | 1/1980 | Parks et al. | |
| 4,249,302 | 2/1981 | Crepeau | 29/830 |
| 4,268,956 | 5/1981 | Parks et al. | |

FOREIGN PATENT DOCUMENTS 1966877 10/1974 Fed. Rep. of Germany ..... 174/68.5

OTHER PUBLICATIONS

IBM Tech. Discl. Bull. vol. 11, No. 8, Jan. 1969, p. 962 by Hermann.
IBM Tech. Discl. Bull. vol. 15, No. 6, Nov. 1972, p. 1999 by Abolafia et al.

Primary Examiner—Howard N. Goldberg
Assistant Examiner—Carl J. Arbes
Attorney, Agent, or Firm—Fishman & Dionne

[57] ABSTRACT

A method of reworking a printed circuit board includes nonconductively adhering a flexible circuit to the board, the flexible circuit comprising a nonconductive substrate provided with a circuit trace. The circuit trace of the flexible circuit and conductors on the circuit board are subsequently electrically interconnected at appropriate positions by establishing conductive paths which extend generally transversely with respect to the circuit board.

7 Claims, 3 Drawing Figures

U.S. Patent
Mar. 27, 1984
4,438,561
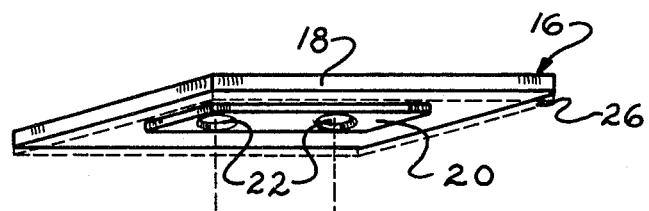
FIG.1
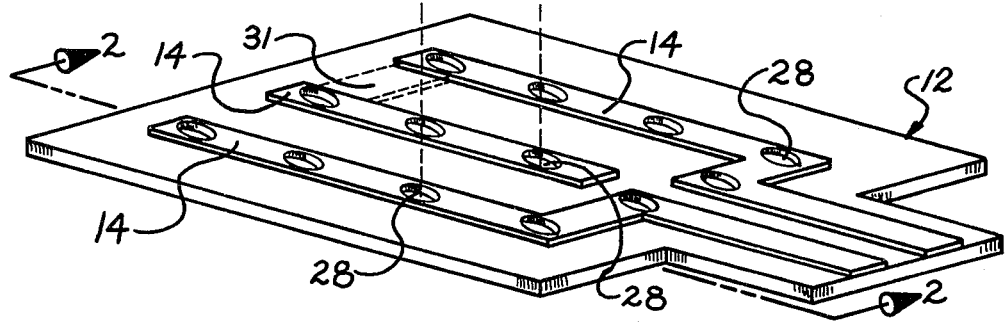
FIG.2
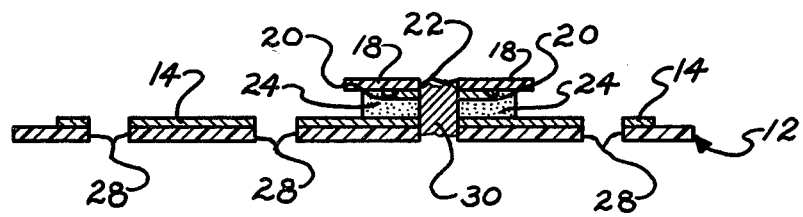
FIG.3
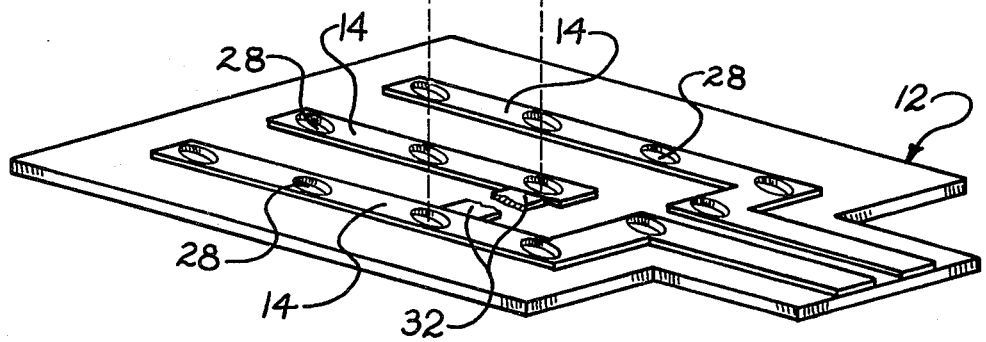

METHOD OF REWORKING PRINTED CIRCUIT BOARDS

BACKGROUND OF THE INVENTION (1) Field of the Invention

The present invention relates to printed circuits and particularly to reworked circuit boards. More specifically, the present invention is directed to a method of repairing or redefining a circuit pattern upon a previously produced printed circuit board. Accordingly, the general objects of the present invention are to provide novel and improved articles and methods of such character.

(2) Description of the Prior Art

Previous methods of reworking printed circuit boards involve removal, typically by a mechanical process, of those unwanted areas of the conductive traces from the circuit to be repaired or altered followed by the soldering of wires to remaining traces to reestablish the old or form new circuit patterns.

These previous methods of reworking printed circuit boards, particularly the establishment or reestablishment of circuit patterns, are inefficient and requires numerous hours of work. Furthermore, problems arise because of faulty soldering and misplaced wires. Additionally, the resulting reworked printed circuit board is cumbersome and esthetically unappealing.

SUMMARY OF THE PRESENT INVENTION

The present invention overcomes the above-discussed disadvantages and other deficiencies of the prior art by providing a novel method of reworking existing printed circuit boards. The present invention also encompasses the unique reworked circuit boards resulting from the practice of said novel method.

In accordance with the present invention a flexible circuit, comprising a nonconductive substrate having a desired circuit pattern supported thereon, is provided. This flexible circuit is characterized by holes at the locations were electrical connections are to be made to the circuit pattern. In practicing the method of the insertion, the flexible circuit is positioned upon the printed circuit board to be reworked at the desired location, so as to effectuate the required alteration of the underlying circuit traces of the printed circuit board. The flexible circuit is adhered to the printed circuit board, with the circuit thereon facing the board, in such a manner so as to prevent establishment of undesired electrical interconnections between conductors on the flexible circuit and on the board to be reworked. This is typically accomplished by adhering the flexible circuit to the circuit board with a nonconductive adhesive. In some circumstances it may be desirable to enhance the electrical isolation between the circuit patterns of the printed circuit board and of the flexible circuit by providing a cover film of insulating material to the circuit pattern of the flexible circuit. Electrical interconnections are made between the circuit pattern of the flexible circuit and conductors of the circuit board via the through holes, typically by the use of solder.

The present method eliminates the need for soldering individual wires upon a printed circuit board and thus minimizes the possibilities of faulty soldering or misplacing the wire connections. Furthermore, the structure resulting from practice of the present invention has a greater degree of permanence in that there are fewer electrical connection failures which is a problem common to the previous reworking methods.

DESCRIPTION OF THE DRAWING

The present invention may be better understood and its numerous objects and advantages will become apparent to those skilled in the art by the accompanying drawing wherein:

FIG. 1 is a perspective exploded view of one embodiment of the present invention;

FIG. 2 is a cross-sectional view of FIG. 2 taken along line 2—2; and

FIG. 3 is a perspective exploded view of another embodiment of the present invention.

DESCRIPTION OF THE PREFERRED EMBODIMENT

Referring to FIGS. 1 and 2 jointly, one embodiment of the present invention is seen. A conventional printed circuit board 12 is provided with various conductors or traces 14 supported on at least a first surface thereof. Printed circuit board 12 may be manufactured by known processes. For the purposes of the present invention this board 12 is a previously manufactured board and will not be discussed in any detail herein. The present invention lies in the specially designed flexible circuit 16 and its use. In this embodiment the flexible circuit 16 is used to interconnect two of the traces 14 on printed circuit board 12, which were not previously connected, thus effectuating a change in the overall circuit pattern.

Flexible circuit 16 is comprised of a substrate 18 which is provided with a desired circuit trace or conductor 20. Substrate 18 is comprised of a nonconductive material that allows the manufacture of a flat flexible board, and is preferably comprised of a polyimide or epoxy resin impregnated nonwoven polyester-glass fabric material. The circuit trace 20 may be comprised of any suitable material, such as a thin copper layer or a conductive ink, and may be applied to substrate 18 by any suitable means, such as by screen printing or any suitable etching or deposition processes. The flexible circuit 16 is further provided with through holes 22, extending through the substrate 18 and conductor 20, in order to facilitate electrical interconnection. The circuit board 12 will typically also have through holes 28 for component insertion or other interconnection purpose.

Circuit trace 20, while being shown as a straight line pattern, may have any desired configuration depending upon the desired electrical interconnections to be established with conductors 14 on the circuit board 12. Furthermore, the through holes 22 may be provided at any point along the circuit trace 20 in order to facilitate electrical interconnection with circuit board 12.

The flexible circuit 16 is positioned upon the printed circuit board so that the circuit trace 20 may, in the manner to be described below, provide interconnection between desired conductors 14 on the circuit board 12. A nonconductive layer 24 (as seen in FIG. 2) is positioned between the circuit trace 20 and the conductors 14 in order to prevent the establishment of undesired electrical connections. Preferably this nonconductive layer 24 is an adhesive used to adhere the flexible circuit 16 to the circuit board 12. If it is necessary to further increase the isolation between the circuit trace 20 and conductors 14, a cover film 26, shown in phantom in FIG. 1, may be applied to flexible circuit 16 over the circuit trace 20. This cover film may be comprised of a sheet of nonconductive material or a cast-on film of, for example, a polyimide material or a solder resist coating.

Electrical interconnection between circuit trace 20 and the underlying conductors 14 of the printed circuit board is preferably accomplished by soldering through the holes 22 and 28; holes 28 being those holes which are normally provided through circuit board 12. This soldering interconnection is typically accomplished by a wave soldering technique. Other means may be provided for electrically interconnecting the conductors 14 with trace 20 such as, for example, by providing pins which extend through the holes 22 and 24 and intercept conductive regions on th flexible circuit 16 and the circuit board 12 at desired locations.

The only requirement for the electrical interconnecting means is that it achieve a satisfactory low resistance electrical interconnection at desired positions, without establishing an electrical interconnection at undesired locations.

It may also be desirable, when changing a circuit pattern, to remove a portion 31 therefrom, such as shown in phantom in FIG. 1. This may be accomplished by any suitable technique, such as a cutting method, to remove the desired section of trace 14.

Referring to FIG. 3 another embodiment of the present invention is seen. In this embodiment the flexible circuit 16 and circuit board 12 are of the same construction and are secured to each other as described above. In the FIG. 3 embodiment a portion 32 of the trace 14 of printed circuit board 12 has been damaged, i.e. cracked, so that the overall circuit is interrupted. Thus in this embodiment the flexible circuit 16 is used to repair a damaged printed circuit board 12 by bridging the portion 32 and mechanically and electrically connecting the flexible circuit 16 to printed circuit board 12 as described above.

While preferred embodiments of the present invention have been described and illustrated, various modifications and substitutions may be made thereto without departing from the spirit and scope of the invention. Accordingly, it is to be understood that the present invention has been described by way of illustration and not limitation.

What is claimed is:

1. A method of connecting electrically unconnected conductors on a printed circuit element with conductors on a flexible circuit element, including the steps of:
   forming said flexible circuit element having a nonconductive substrate and a predetermined circuit pattern;
   defining at least two through holes in said circuit pattern;
   aligning said flexible circuit with respect to said printed circuit element with said circuit pattern facing said unconnected conductors, said circuit pattern being aligned with the unconnected conductors on the printed circuit element with said at least two through holes aligned with different ones of said unconnected conductors;
   adhering said flexible circuit element to said printed circuit element with an electrically nonconductive adhesive between said circuit pattern and said unconnected conductors; and
   establishing electrically conductive paths in said at least two through holes in contact with said conductors on the printed circuit element and with said circuit pattern on said flexible circut element to electrically interconnect said conductors.

2. The method of claim 1, wherein:
   said printed circuit element is provided with through holes in said conductors; and
   said step of establishing electrically conductive paths includes aligning said at least two through holes in said circuit pattern being aligned with two through holes in said conductors and establishing electrically conductive paths in said two through holes in said conductors and in said at least two through holes in said circuit pattern.

3. The method of claim 2 further including the step of:
   placing a cover film over the circuit pattern of the nonconductive substrate.

4. The method of claim 3 wherein the step of placing a cover film over the circuit pattern includes:
   selecting a cover film from the group consisting of a polyimide material and a solder resist coating.

5. The method of claim 2 wherein the step of establishing electrically conductive paths includes applying solder through two aligned through holes in said conductors and said at least two through holes in said circuit pattern.

6. The method of claim 2 wherein the step of establishing electrically conductive paths includes positioning a properly dimensioned pin through aligned through holes in said conductors and said at least two through holes in said circuit pattern.

7. The method of claim 1 wherein the step of forming a nonconductive substrate with a predetermined circuit pattern first involves the step of selecting a nonwoven polyester-glass fabric material which is impregnated with a material selected from the group consisting of polyimide and epoxy resin materials as the nonconductive substrate.

* * * * *